(12) United States Patent
Hsu et al.

(10) Patent No.: US 11,280,561 B2
(45) Date of Patent: Mar. 22, 2022

(54) CURRENT STABILIZATION AND PRESSURE BOOSTING DEVICE FOR EVAPORATOR

(71) Applicant: LDC Precision Engineering CO., Ltd., New Taipei (TW)

(72) Inventors: Chi-Feng Hsu, New Taipei (TW); Cheng-Jen Liang, New Taipei (TW); Chih-Wei Chen, New Taipei (TW)

(73) Assignee: LDC PRECISION ENGINEERING CO., LTD., New Taipei (TW)

( * ) Notice: Subject to any disclaimer, the term of this patent is extended or adjusted under 35 U.S.C. 154(b) by 70 days.

(21) Appl. No.: 16/783,445

(22) Filed: Feb. 6, 2020

(65) Prior Publication Data
US 2021/0247150 A1 Aug. 12, 2021

(51) Int. Cl.
| | |
|---|---|
| H05K 7/20 | (2006.01) |
| F28D 15/02 | (2006.01) |
| F28F 3/12 | (2006.01) |
| F28F 3/08 | (2006.01) |
| F28D 5/00 | (2006.01) |
| F28D 21/00 | (2006.01) |

(52) U.S. Cl.
CPC ............. *F28F 3/08* (2013.01); *F28D 5/00* (2013.01); *F28F 3/12* (2013.01); *F28D 15/0266* (2013.01); *F28D 2021/0029* (2013.01); *F28D 2021/0064* (2013.01); *H05K 7/20254* (2013.01); *H05K 7/20309* (2013.01)

(58) Field of Classification Search
CPC ............ H05K 7/20309; H05K 7/20254; F28D 2021/0064; F28D 2021/0029; F28D 15/0266; F28F 3/08; F28F 3/12
See application file for complete search history.

(56) References Cited

U.S. PATENT DOCUMENTS

| | | | |
|---|---|---|---|
| 6,729,389 B2 * | 5/2004 | Ohashi .................. | H01L 23/473 165/170 |
| 7,516,777 B2 * | 4/2009 | Terakado ................ | F28F 13/06 165/80.4 |

\* cited by examiner

*Primary Examiner* — Leonard R Leo
(74) *Attorney, Agent, or Firm* — Chun-Ming Shih; Lanway IPR Services

(57) ABSTRACT

A current stabilization and pressure boosting device for evaporator is disclosed, comprising a heat-sinking module and an outer case, wherein the heat-sinking module is assembled by successively stacking a large number of heat-sinking components, with each of the heat-sinking components having a first board surface, a second board surface and a third board surface, so that the insides of such heat-sinking components form a semi-open inner flow channel, and a fourth board surface is further respectively provided at the two ends of the heat-sinking components opposite to the inner flow channel, and the heat-sinking module is respectively configured with a water injection channel and an air exhausting channel, and the heat-sinking module is installed inside the outer case and the outer lid.

4 Claims, 20 Drawing Sheets

CURRENT STABILIZATION AND PRESSURE BOOSTING DEVICE FOR EVAPORATOR

BACKGROUND OF THE INVENTION

1. Field of the Invention

The present invention generally relates to a current stabilization and pressure boosting device for evaporator; in particular, it relates to a heat-sinking structure which is capable of internally performing liquid-to-gas conversions on liquid water in order to achieve the heat dissipation function and is suitable for various electronic components with respect to heat dissipation purpose.

2. Description of Related Art

In recent years, the heat generation of electronic components has been increasing rapidly with the precision improvements of semiconductor processes. Therefore, how to enhance the heat-sinking capability of electronic components in order to maintain the normal operations of components has become a very important engineering issue. Direct air cooling technology, which has been comprehensively utilized in various fields at present, is no longer appropriate for fulfilling heat dissipation requirements of many electronic components featuring high heat flux, indicating that other solutions need to be sought.

Among the existing technologies, in addition to the aforementioned air-cooling technology, there is also another type of technology which applies liquid-to-gas conversion of water to achieve the heat dissipation effect. This technology provides two sets of heat spreaders and two sets of connected pipes, in which one set of heat spreaders is used to evaporate in order to remove the heat absorbed by water, while the other set of heat spreaders used to condense so as to cool down to bring back the outputted water for subsequent cooling processes to achieve the heat dissipation effect. It can be seen that the pressures in such two sets of heat spreaders are different, so the water can be automatically transported back and forth during operations thus forming a cycling loop. However, since there will be a large amount of water circulating inside the heat spreaders, in case the water circulation path is not restricted, the internal water is prone to leakage problems, and the pressure cannot be properly maintained therein, thus probably disturbing the internal water circulation condition and adversely affecting the usage efficiency thereof.

Therefore, to address the above-said issues, a heat-sinking module has been designed which can block the water inside the heat-sinking module from directly contacting the outer case in order to eliminate leakage problems, and also restrict the water flow direction so as to effectively retain the water heated and evaporated within the heat-sinking module thereby quickly raising the internal pressure such that water can be stably and quickly discharged in order to improve the stability of the water flow; accordingly, the present invention provides a current stabilization and pressure boosting device for evaporator as the optimal solution.

SUMMARY OF THE INVENTION

A current stabilization and pressure boosting device for evaporator according to the present invention is disclosed, comprising a heat-sinking module and an outer case, wherein the heat-sinking module is assembled by successively stacking a large number of heat-sinking components, with each of the heat-sinking components having a first board surface, a second board surface and a third board surface, so that the insides of such heat-sinking components form a semi-open inner flow channel, and a fourth board surface is further respectively provided at the two ends of the heat-sinking components opposite to the inner flow channel, and the heat-sinking module is respectively configured with a water injection channel and an air exhausting channel which are not connected to the outside; moreover, the outer case is internally configured with a chamber for placing the heat-sinking module, and the outer case includes an outer lid for covering the chamber, and the outer case is further respectively configured with a water inlet and an air outlet, in which the water inlet corresponds to the position of the water injection channel, and the air outlet corresponds to the position of the air exhausting channel; accordingly, the water inlet allows liquid water to flow in and evaporate in each of the inner flow channels, and then is discharged from the air outlet, and the fourth board surface can effectively block at both ends of each of the inner flow channels, so that the liquid water or gaseous water in each of the inner flow channels can be prevented from directly contacting the chamber and the outer lid from both ends of each inner flow channel, thus eliminating overflow and leakage issues, and, in addition, the liquid water or gaseous water can be massively retained in each inner flow channel, wherein liquid water can be stably heated and then evaporate thereby allowing gaseous water to be quickly discharged from the air exhausting channel so as to stabilize the internal water flow.

In a preferred embodiment, the two ends of each of the heat-sinking components are closely attached to the chamber, and the heat-sinking module is configured with at least one channel penetrating each of the heat-sinking components.

In a preferred embodiment, a predetermined space is configured between the two ends of each of the heat-sinking components and the inner lateral surface of the chamber.

In a preferred embodiment, an impedance block is installed between the two ends of each of the heat-sinking components and the inner lateral surface of the chamber with each impedance block being placed on one side close to the air outlet, such that liquid water or gaseous water in each inner flow channel can be prevented from directly contacting the chamber and the outer lid from both ends of each inner flow channel thereby further eliminating overflow and leakage issues at the joint.

In a preferred embodiment, each of the impedance blocks is installed on one side of the outer lid opposite to the chamber.

In a preferred embodiment, the fourth board surface is formed by the two ends of the first board surface extending toward the inner flow channel, and the extension length of the fourth board surface is the same as that of the second board surface and the third board surface, such that the fourth board surface is completely blocked at the two ends of each of the inner flow channels.

In a preferred embodiment, the fourth board surface is formed by the two ends of the first board surface extending toward the middle of the inner flow channel, and the extension length of the fourth board surface is the same as that of the second board surface and the third board surface, such that the fourth board surface is completely blocked at the middle of the two ends of each of the inner flow channels.

In a preferred embodiment, the fourth board surface is formed by the two ends of the first board surface extending toward the upside of the inner flow channel, and the extension length of the fourth board surface is the same as that of the second board surface and the third board surface, such that the fourth board surface is completely blocked at the upside of the two ends of each of the inner flow channels.

In a preferred embodiment, the downside of the two ends of the first board surface extends outwards to form a protrusion section.

In a preferred embodiment, the fourth board surface is formed by the two ends of the first board surface extending toward the inner flow channel, and the extension length of the fourth board surface is shorter than that of the second board surface and the third board surface, such that the fourth board surface is not completely blocked at the two ends of each of the inner flow channels.

In a preferred embodiment, a slot is respectively configured at the upside of the two ends of the first board surface, and the fourth board surface is inserted into the slot.

DETAILED DESCRIPTION OF THE PREFERRED EMBODIMENTS

Other technical contents, aspects and effects in relation to the present invention can be clearly appreciated through the detailed descriptions concerning the preferred embodiments of the present invention in conjunction with the appended drawings.

Figure 1:
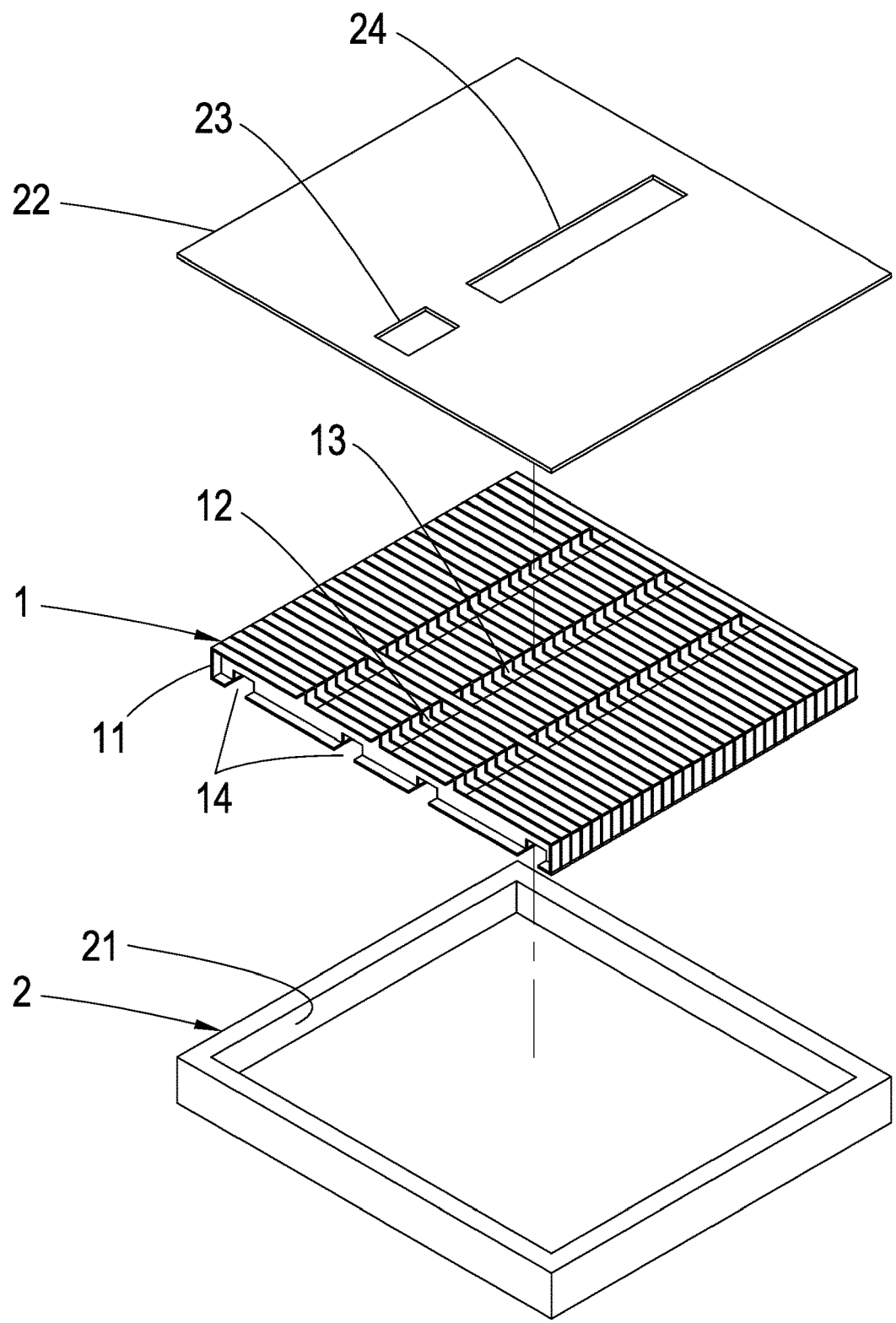
FIG. 1 shows a stereo disassembled view for a first embodiment of the current stabilization and pressure boosting device for evaporator according to the present invention.
Figure 2:
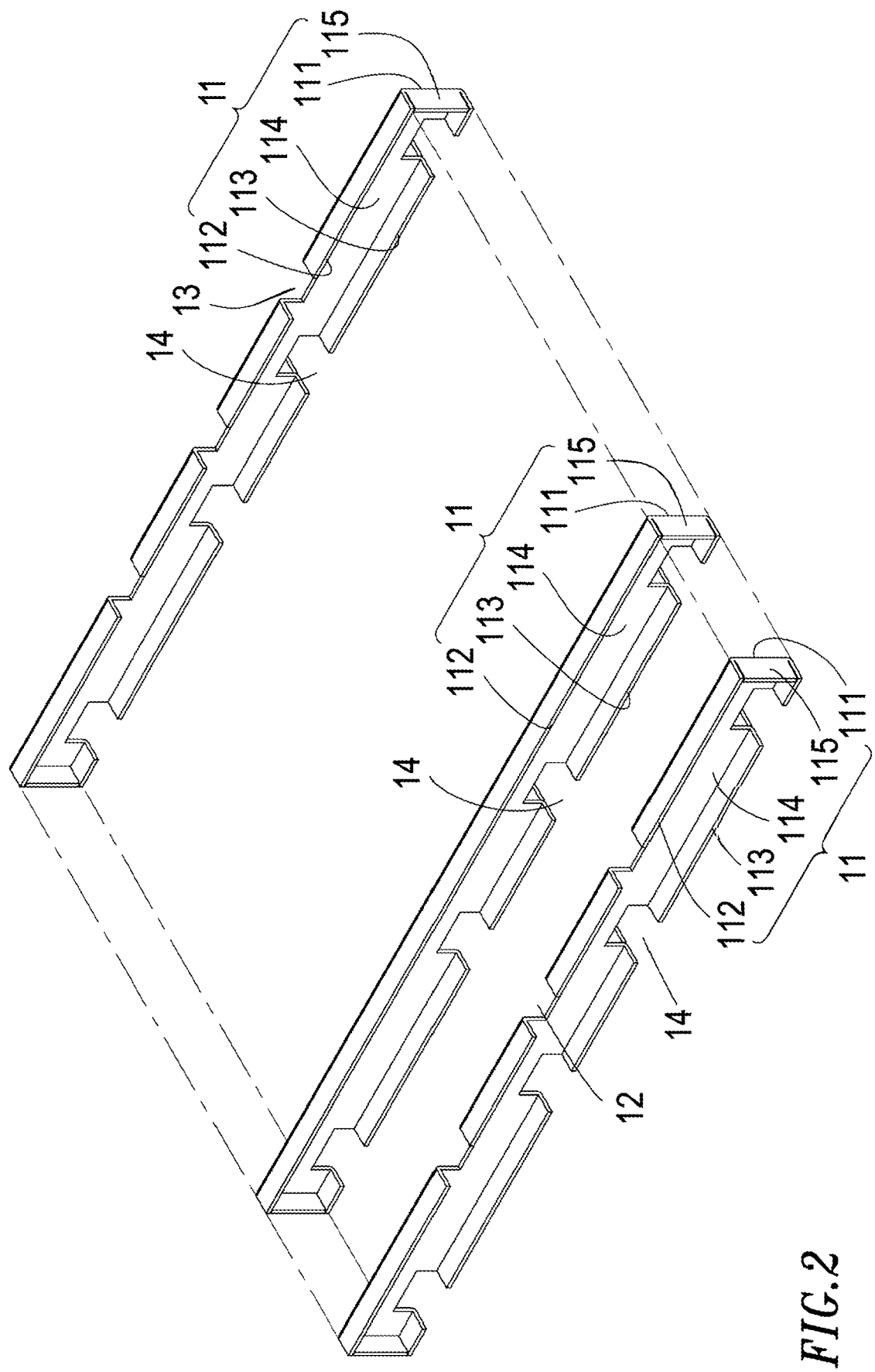
FIG. 2 shows a configuration stereo view for the first embodiment of the current stabilization and pressure boosting device for evaporator according to the present invention.
Figure 3:
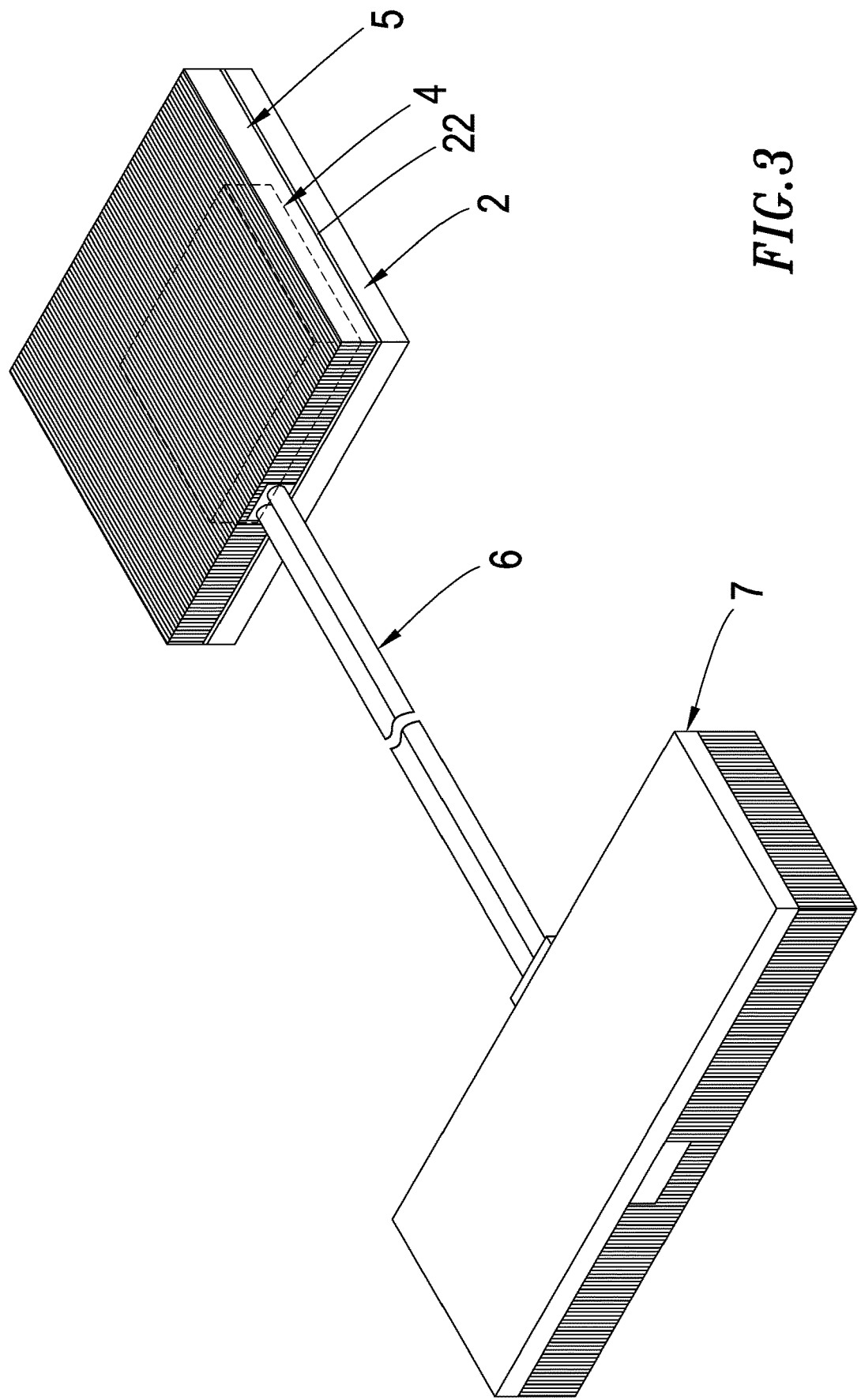
FIG. 3 shows an integral view of the current stabilization and pressure boosting device for evaporator according to the present invention, in combination with a condenser in use.
Figure 4:
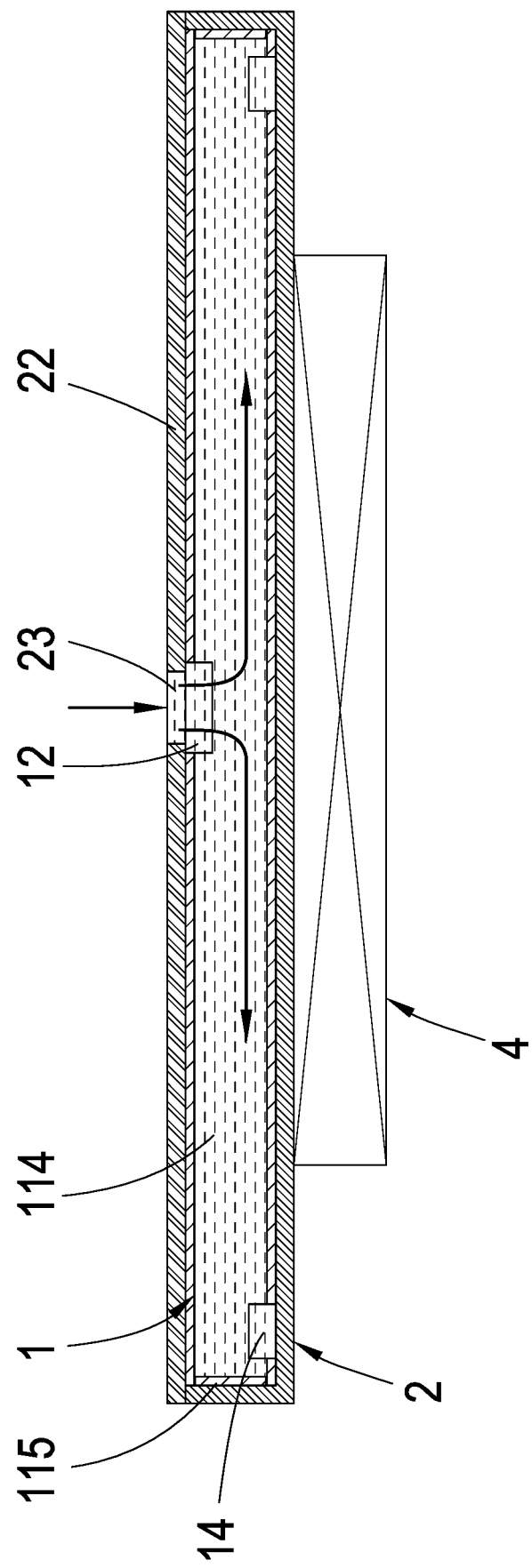
FIG. 4 shows an operating cross-sectioned view for the first embodiment of the current stabilization and pressure boosting device for evaporator according to the present invention.

Refer first to FIGS. 1~2, wherein a stereo view and an internally structural cross-sectioned view of a current stabilization and pressure boosting device for evaporator according to the present invention are respectively shown. As shown in these Figures, the first embodiment of the current stabilization and pressure boosting device for evaporator according to the present invention comprises a heat-sinking module 1 and an outer case 2.

Herein heat-sinking module 1 is assembled by successively stacking a large number of heat-sinking components 11, with each of the heat-sinking components 11 having a first board surface 111, a second board surface 112 and a third board surface 113, in which the first board surface 111, second board surface 112 and third board surface 113 are integrally formed or fixedly attached with each other, such that the insides of such heat-sinking components 11 form a semi-open inner flow channel 114; besides, a fourth board surface 115 is further respectively provided at the two ends of the heat-sinking components 11 opposite to the inner flow channel 114, and the heat-sinking module 1 is respectively configured with a water injection channel 12 and an air exhausting channel 13 (i.e., part of the heat-sinking components 11 are provided with the water injection channel 12, and part of the heat-sinking components 11 are provided with the air exhausting channel 13), and the heat-sinking module 1 can be openly configured with at least one channel 14 penetrating through each of the heat-sinking components 11.

Meanwhile, the outer case 2 is internally configured with a chamber 21 for placing the heat-sinking module 1, with the two sides of the heat-sinking components 11 being closely attached to the inside of the chamber 21, and the outer case 2 also includes an outer lid 11 for covering in fit the chamber 21; in addition, and the outer case 2 is further respectively configured with a water inlet 23 and an air outlet 24, in which the water inlet 23 corresponds to the position of the water injection channel 12, and the air outlet 24 corresponds to the position of the air exhausting channel 13.

Refer next to FIGS. 3~6, and it can be seen that an electronic component 4 can be locked onto the bottom surface of the outer case 2; also, heat-sinking fins 5 and a connection tube 6 can be conjunctively installed on the outer lid 22, and the connection tube 6 is connected to a condenser 7.

When the electronic component 4 generates heat, the thermal energy generated by the electronic component 4 can be introduced into the interior of the outer case 2 and conducted to the heat-sinking module 1, so the heat dissipated by the heat-sinking module 1 causes the internal liquid water to evaporate into gaseous water which then passes upward through the air exhausting channel 13 and the air outlet 24 and sequentially enters the connection tube 6 to the condenser 7; herein the gaseous water entering the condenser 7 will become liquid water after cooling, thus passing through the connection tube 6 and returning back into the heat-sinking module 1.

The backflow of liquid water will sequentially pass through the water inlet 23 and the water injection channel 12 into each of the inner flow channels 114, and then circulate through each of the channels 14 to all parts of each of the heat-sinking module 1; therefore, repeatedly, it evaporates into gaseous water and can be continuously circulated to achieve the purpose of circulating heat dissipation.

Figure 5:
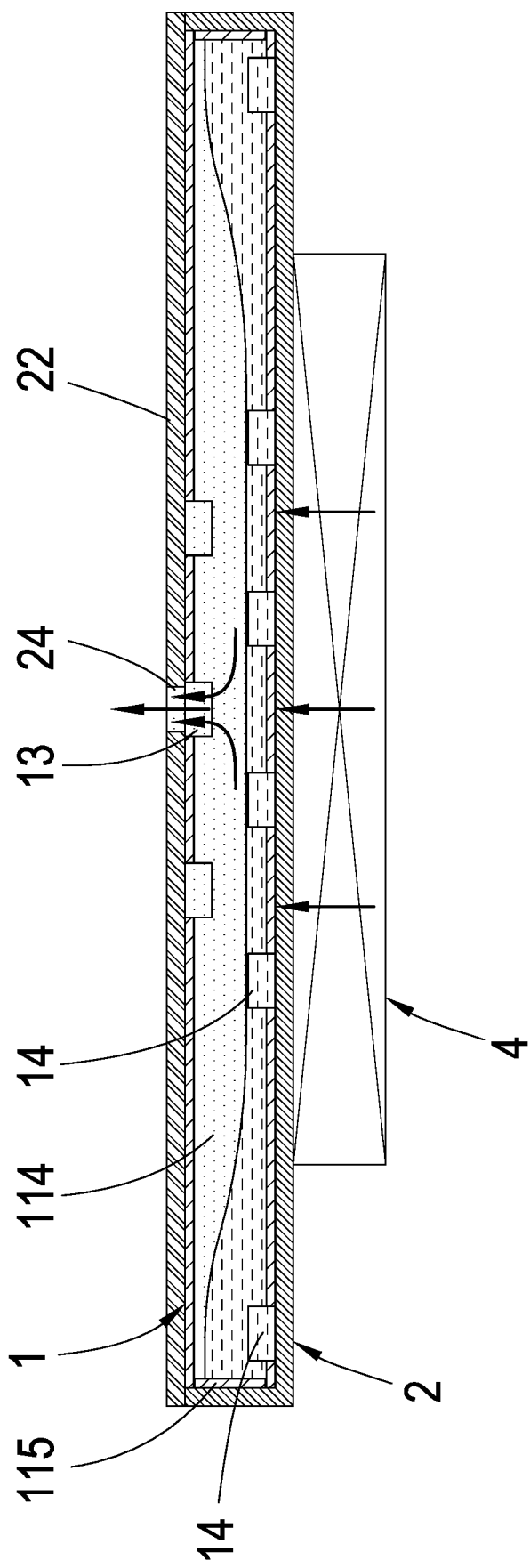
FIG. 5 shows an operating cross-sectioned view for the first embodiment of the current stabilization and pressure boosting device for evaporator according to the present invention.
Figure 6:
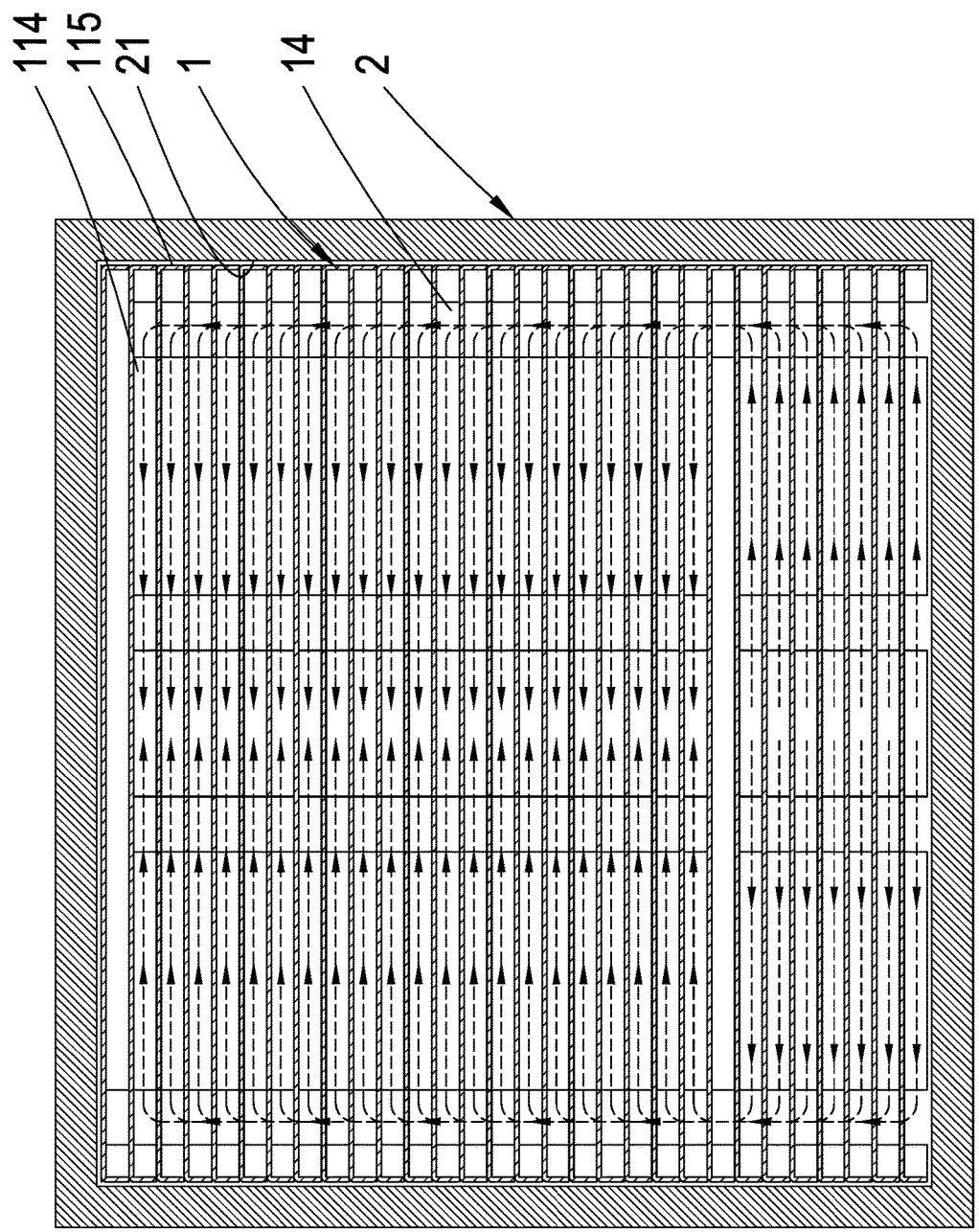
FIG. 6 shows an operating cross-sectioned view for the first embodiment of the current stabilization and pressure boosting device for evaporator according to the present invention.
Figure 7:
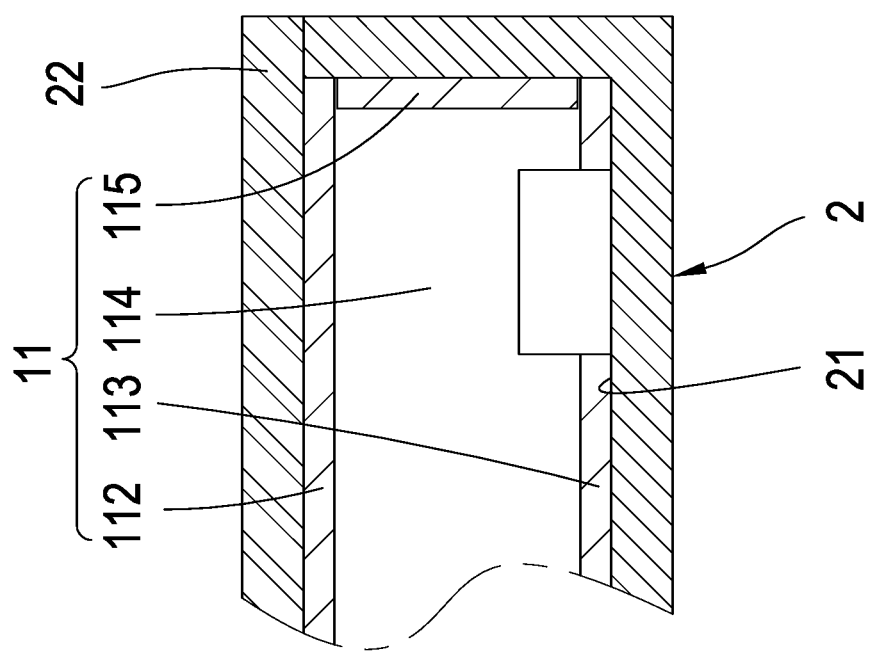
FIG. 7 shows a partial cross-sectioned view for the first embodiment of the current stabilization and pressure boosting device for evaporator according to the present invention.

Next, refer to FIGS. 5 and 7, wherein the fourth board surface 115 is installed at the two ends of each of the inner flow channels 114 so that liquid water or gaseous water in each of the inner flow channels 114 will not be able to directly contact the chamber 21 and the outer lid 22 from the two ends of the inner flow channel 114, thereby preventing the overflow or leakage issues at the joints; at the same time, a large amount of liquid water or gaseous water is retained in each of the inner flow channels 114, and the liquid water is stably heated and evaporated to allow gaseous water, especially the gaseous water blocked at both ends of each of the inner flow channels 114, to rapidly increase the internal pressure in order to create a high pressure therein which then quickly forces the gaseous water to be discharged from the air exhausting channel 13 such that the internal water flow can be stabilized.

Figure 8A:
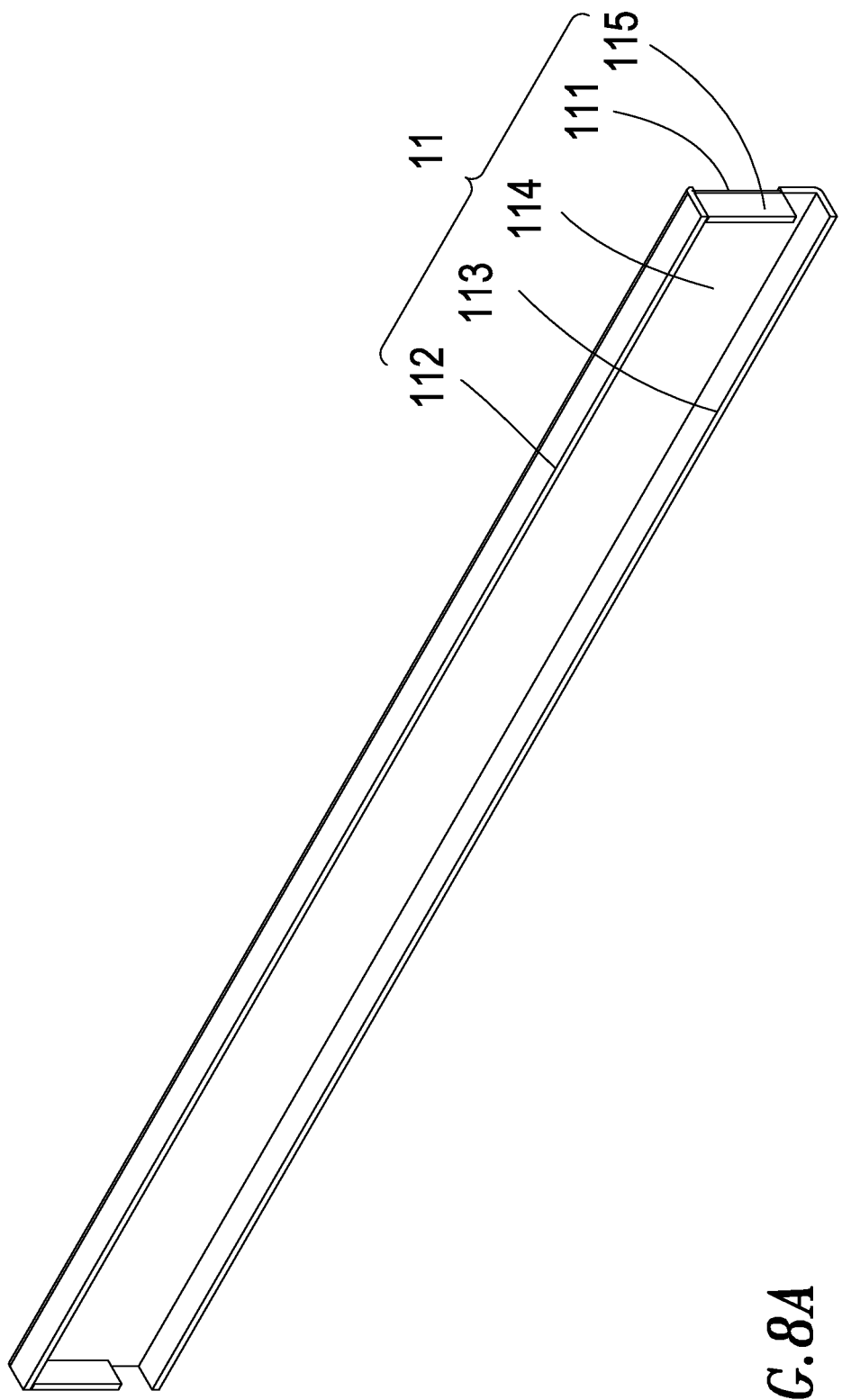
FIG. 8A shows a configuration stereo view for a second embodiment of the current stabilization and pressure boosting device for evaporator according to the present invention.
Figure 8B:
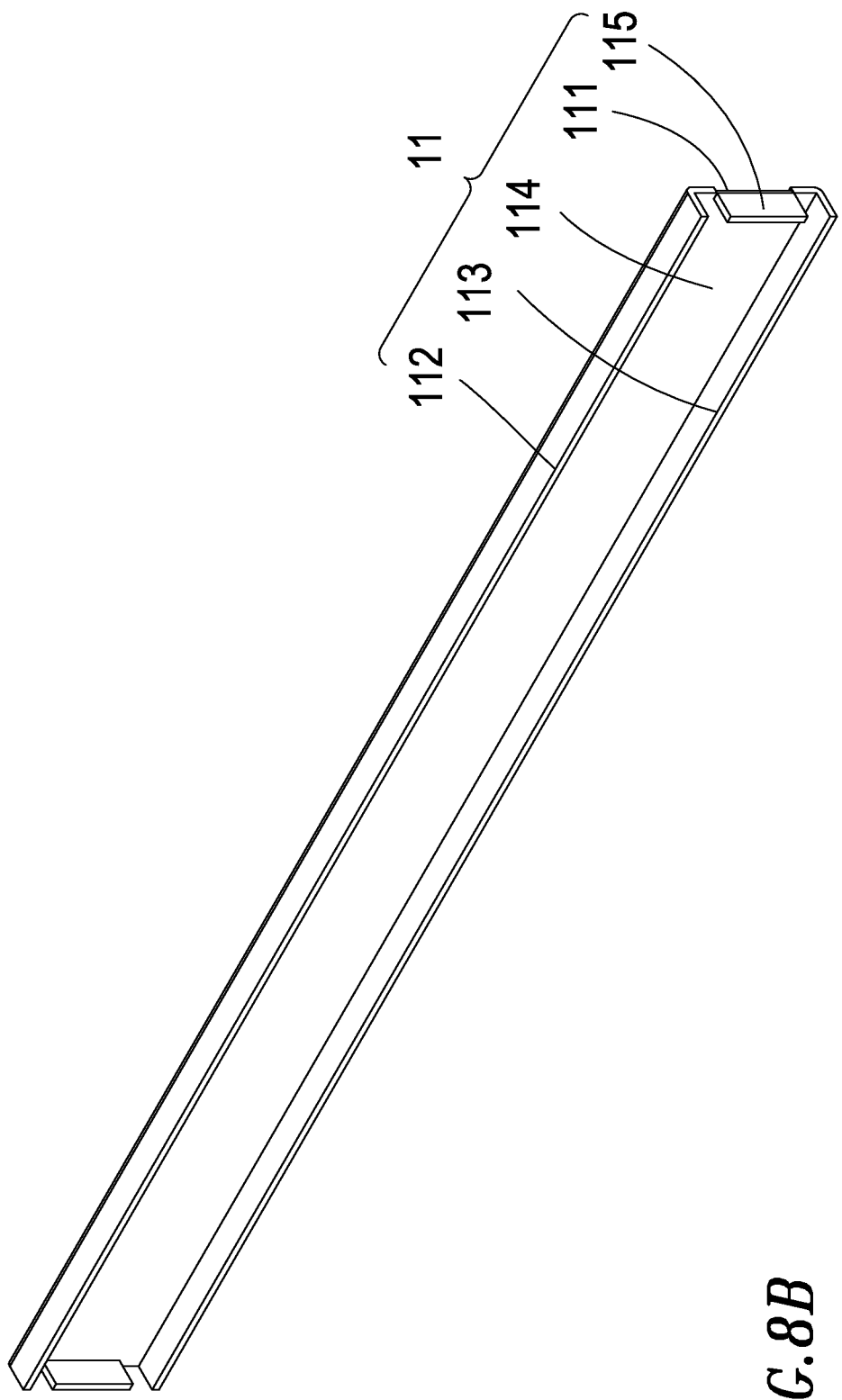
FIG. 8B shows a configuration stereo view for a third embodiment of the current stabilization and pressure boosting device for evaporator according to the present invention.
Figure 8C:
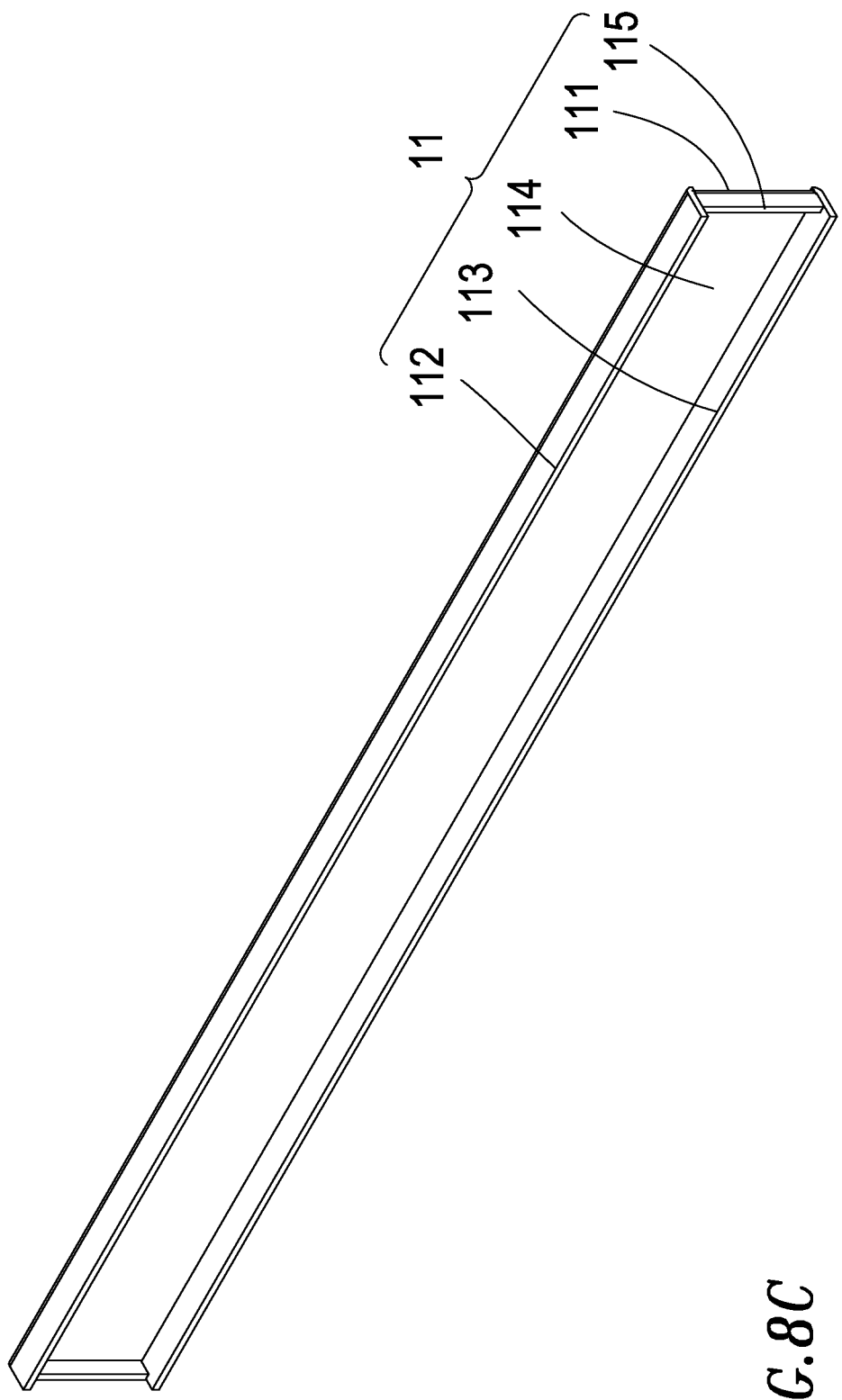
FIG. 8C shows a configuration stereo view for a fourth embodiment of the current stabilization and pressure boosting device for evaporator according to the present invention.
Figure 8D:
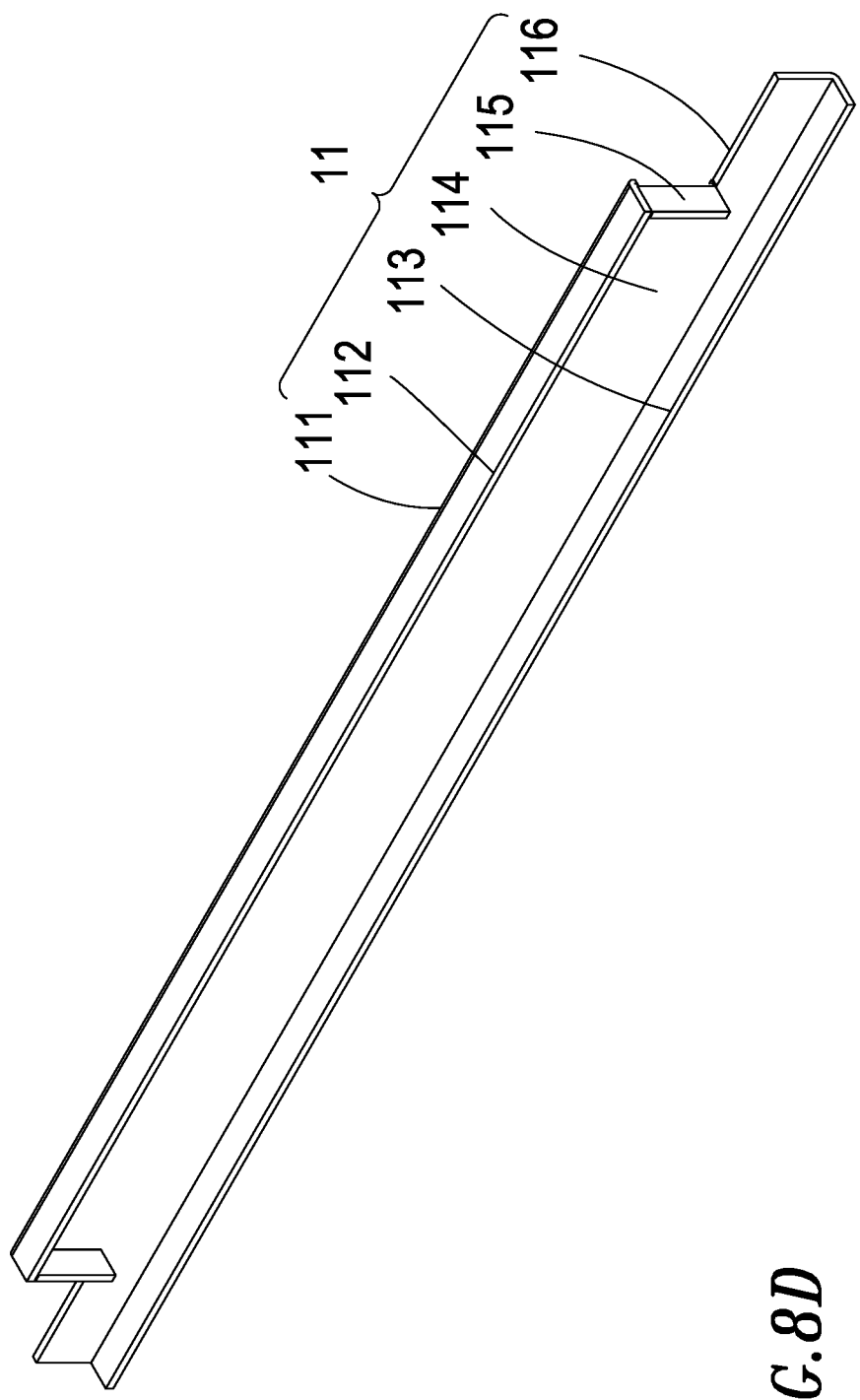
FIG. 8D shows a configuration stereo view for a fifth embodiment of the current stabilization and pressure boosting device for evaporator according to the present invention.
Figure 8E:
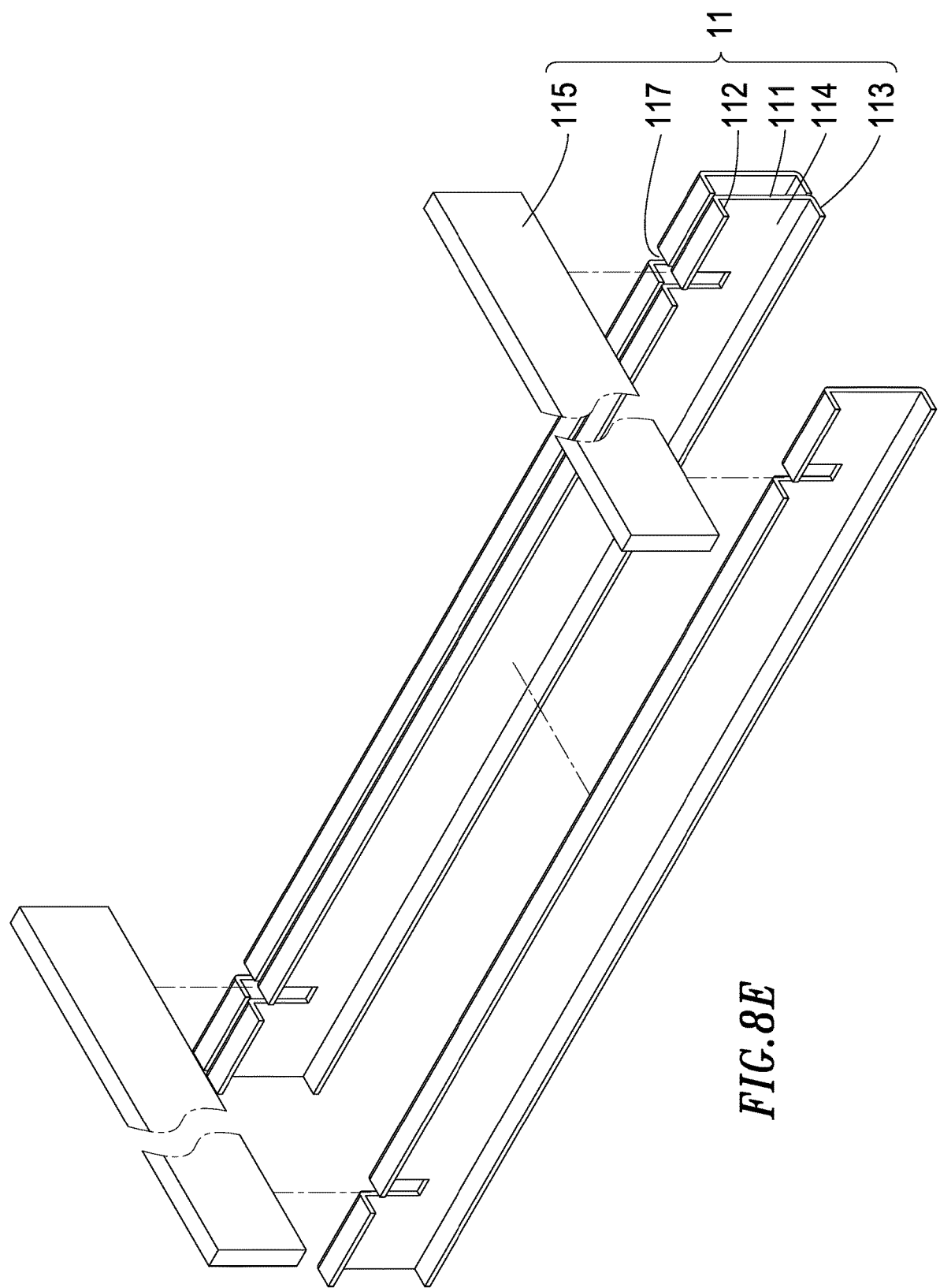
FIG. 8E shows a configuration stereo view for a sixth embodiment of the current stabilization and pressure boosting device for evaporator according to the present invention.

Subsequently, FIG. 2 shows a first embodiment for the heat-sinking component 11 of the current stabilization and pressure boosting device for evaporator according to the present invention. It can be seen that the fourth board surface 115 of the heat-sinking component 11 is formed by the two ends of the first board surface 111 extending in the direction of the inner flow channel 114, and the extension length of the fourth board surface 115 is the same as that of the second board surface 112 and the third board surface 113, and the fourth board surface 115 is completely blocked at the two ends of each of the inner flow channels 114. Besides, refer to FIG. 8A, which illustrates a second embodiment of the heat-sinking component 11, wherein this fourth board surface 115 is formed by the two ends of the first board surface 111 extending towards the upside in the direction of the inner flow channel 114, and the extension length of the fourth board surface 115 is the same as that of the second board surface 112 and the third board surface 113, and the fourth board surface 115 is blocked only at the upside on the two ends of each of the inner flow channels 114. Additionally, refer to FIG. 8B, which illustrates a third embodiment of the heat-sinking component 11, wherein the fourth board surface 115 is formed by the two ends of the first board surface 111 extending towards the middle in the direction of the inner flow channel 114, and the extension length of the fourth board surface 115 is the same as that of the second board surface 112 and the third board surface 113, and the fourth board surface 115 is blocked only at the middle on the two ends of each of the inner flow channels 114. Also, refer to FIG. 8C, which illustrates a fourth embodiment of the heat-sinking component 11, wherein the fourth board surface 115 is formed by the two ends of the first board surface 111 extending towards the direction of the inner flow channel 114, and the extension length of the fourth board surface 115 is shorter than that of the second board surface 112 and the third board surface 113, and the fourth board surface 115 is incompletely blocked on the two ends of each of the inner flow channels 114. Moreover, refer to FIG. 8D, which illustrates a fifth embodiment of the heat-sinking component 11, wherein the fourth board surface 115 is formed by the two ends of the first board surface 111 extending towards the upside in the direction of the inner flow channel 114, while the downside of the two ends of the first board surface 111 extends towards outside to form a protrusion section 116, and the extension length of the fourth board surface 115 is the same as that of the second board surface 112 and the third board surface 113, and the fourth board surface 115 is blocked only at the upside on the two ends of each of the inner flow channels 114. Furthermore, refer to FIG. 8E, which illustrates a sixth embodiment of the heat-sinking component 11, wherein a slot 117 is respectively formed at the upside close to the two ends of the first board surface 111, and the fourth board surface 115 is inserted in the slot 117, and the fourth board surface 115 is blocked only at the upside on the two ends of each of the inner flow channels 114. It should be understood that the first embodiment is in the form of full blocking, while the second to sixth embodiments are in the form of half blocking, so that the user may select one type of the above-mentioned heat-sinking components 11 in the intended configuration. That is, If the heat-sinking component 11 in the full-blocking type is used, then the heat-sinking module 1 must be configured with at least one channel 14 penetrating each of the heat-sinking components 11; in contrast, if the heat-sinking component 11 in the half-blocking type is used, then the heat-sinking module 1 can be selectively configured with or without the channel 14.

Figure 9:
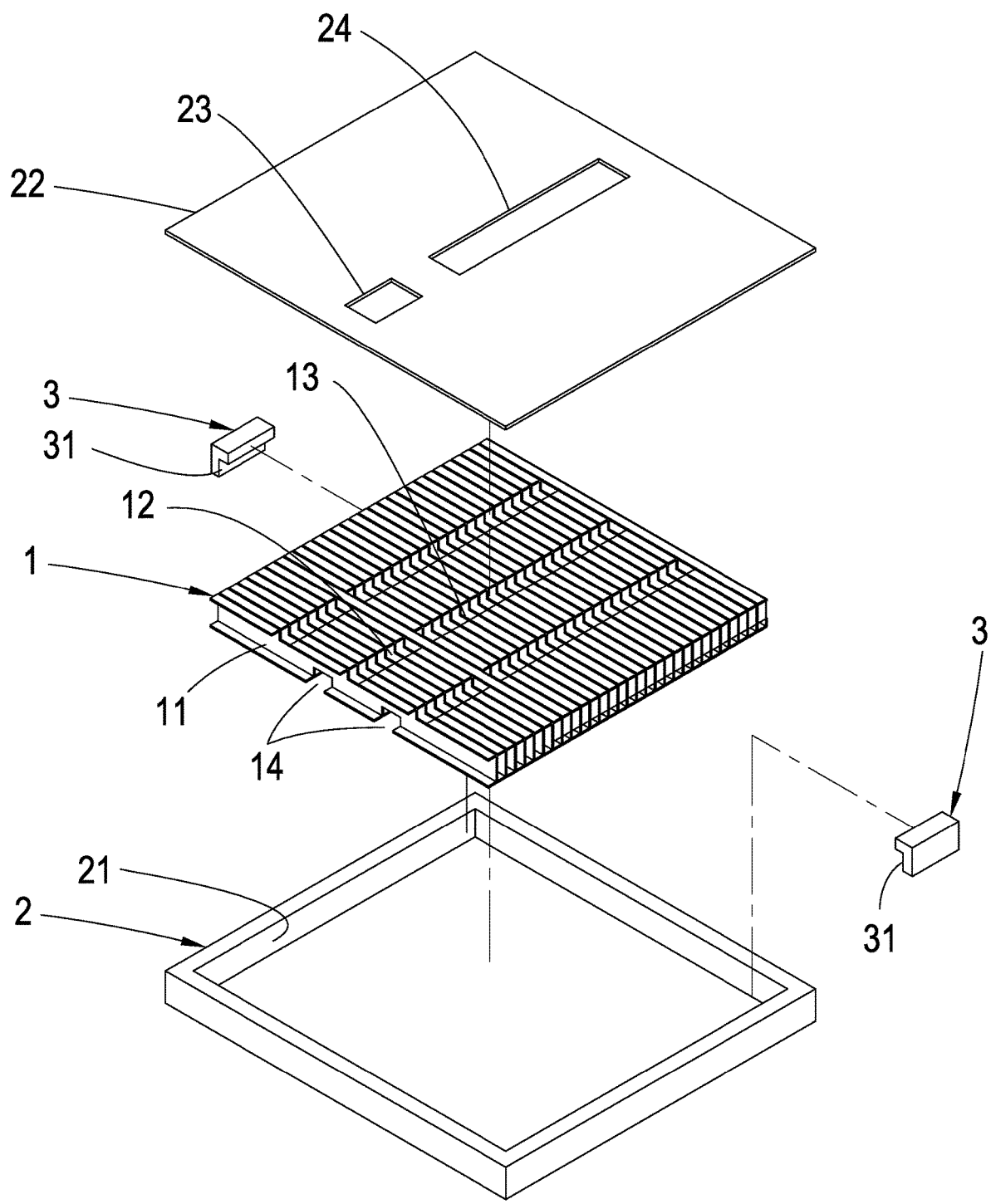
FIG. 9 shows a stereo disassembled view for the second embodiment of the current stabilization and pressure boosting device for evaporator according to the present invention.
Figure 10:
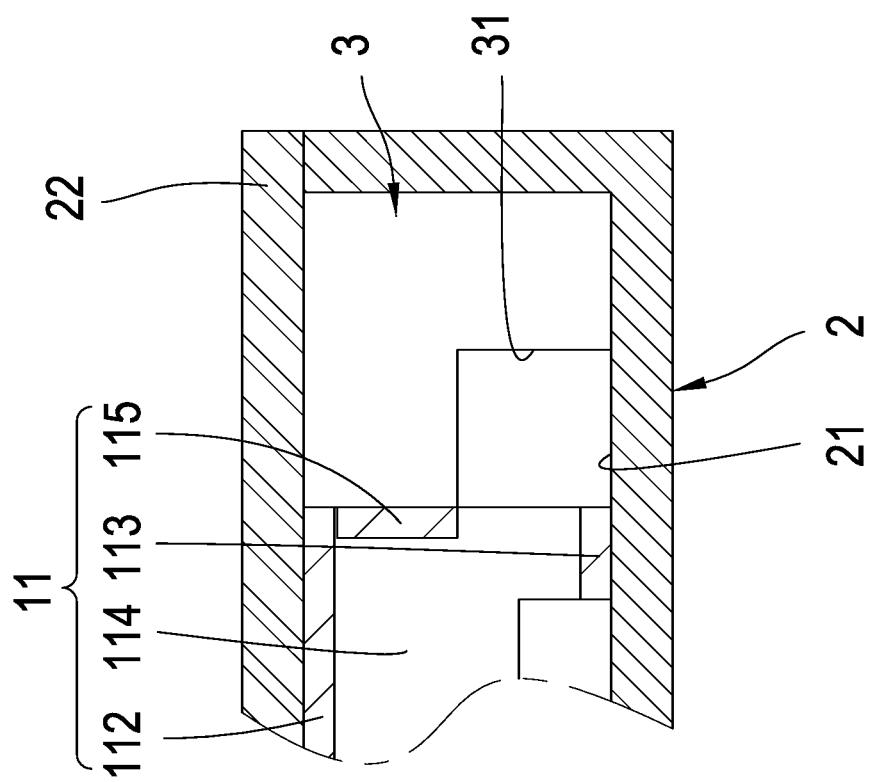
FIG. 10 shows a partial cross-sectioned view for the second embodiment of the current stabilization and pressure boosting device for evaporator according to the present invention.

Then, refer to FIGS. 9 and 10, in which the second embodiment for the integral structure configuration of the current stabilization and pressure boosting device for evaporator according to the present invention are shown. It can be observed that, in the present embodiment, a predetermined space is configured between the two ends of each of the heat-sinking components 11 and the inner lateral surface of the chamber 21, and an impedance block 3 is installed between the two ends of each of the heat-sinking components 11 and the inner lateral surface of the chamber 21 with each impedance block 3 being placed on one side close to the air outlet 13, such that liquid water or gaseous water in each inner flow channel 114 can be prevented from directly contacting the chamber 21 and the outer lid 22 from both ends of each inner flow channel 114 thereby further eliminating overflow and leakage issues at the joint. Meanwhile, a large amount of liquid water or gaseous water is retained in each of the inner flow channels 114, and the liquid water is stably heated and evaporated to allow gaseous water, especially the gaseous water blocked at both ends of each of the inner flow channels 114, to rapidly increase the internal pressure in order to create a high pressure therein which then quickly forces the gaseous water to be discharged from the air exhausting channel 13 such that the internal water flow can be stabilized. In addition, each of the heat-sinking components 11 applies the half-blocking configuration as illustrated in the above-said second to sixth embodiments (corresponding to FIGS. 8A, 8B, 8C, 8D and 8E, and herein the second embodiment is used in the Figure), and a notch 31 is openly provided on the impedance block 3 with respect to the two ends of each of the inner flow channels 114 in order to maintain a space for liquid water or gaseous water to flow through.

Figure 11:
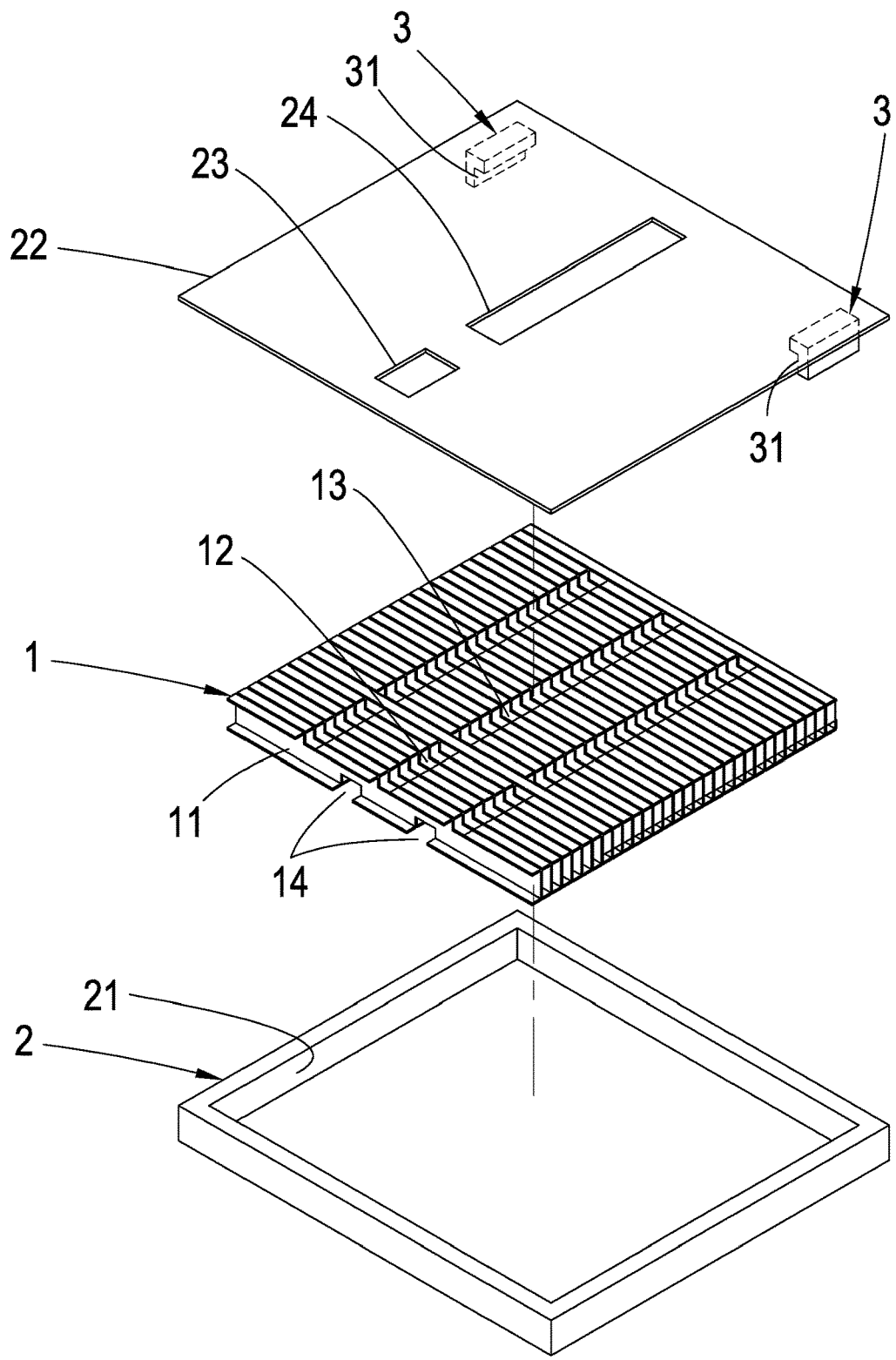
FIG. 11 shows a stereo disassembled view for the third embodiment of the current stabilization and pressure boosting device for evaporator according to the present invention.

Refer next to FIG. 11, in which a third embodiment for the integral structure configuration of the current stabilization and pressure boosting device for evaporator according to the present invention is shown, which exhibits an extension of the second embodiment. In the present embodiment, a predetermined space is configured between the two ends of each of the heat-sinking components 11 and the inner lateral surface of the chamber 21, and each of the impedance blocks 3 is disposed on a side of the outer cover 22 opposite to the chamber 21, so that, when the outer lid 22 covers in fit the chamber 21, each of the impedance blocks 3 can be inserted between the two ends of the heat-sinking components 11 and the inner surface of the chamber 21; moreover, each of the heat-sinking components 11 uses a half-blocking configuration illustrated in the second to sixth embodiments (equivalent to FIGS. 8A, 8B, 8C, 8D and 8E, and the Figure uses the second embodiment), and a notch 31 is openly provided on the impedance block 3 with respect to the two ends of each of the inner flow channels 114 in order to maintain a space for liquid water or gaseous water to flow through.

Figure 12:
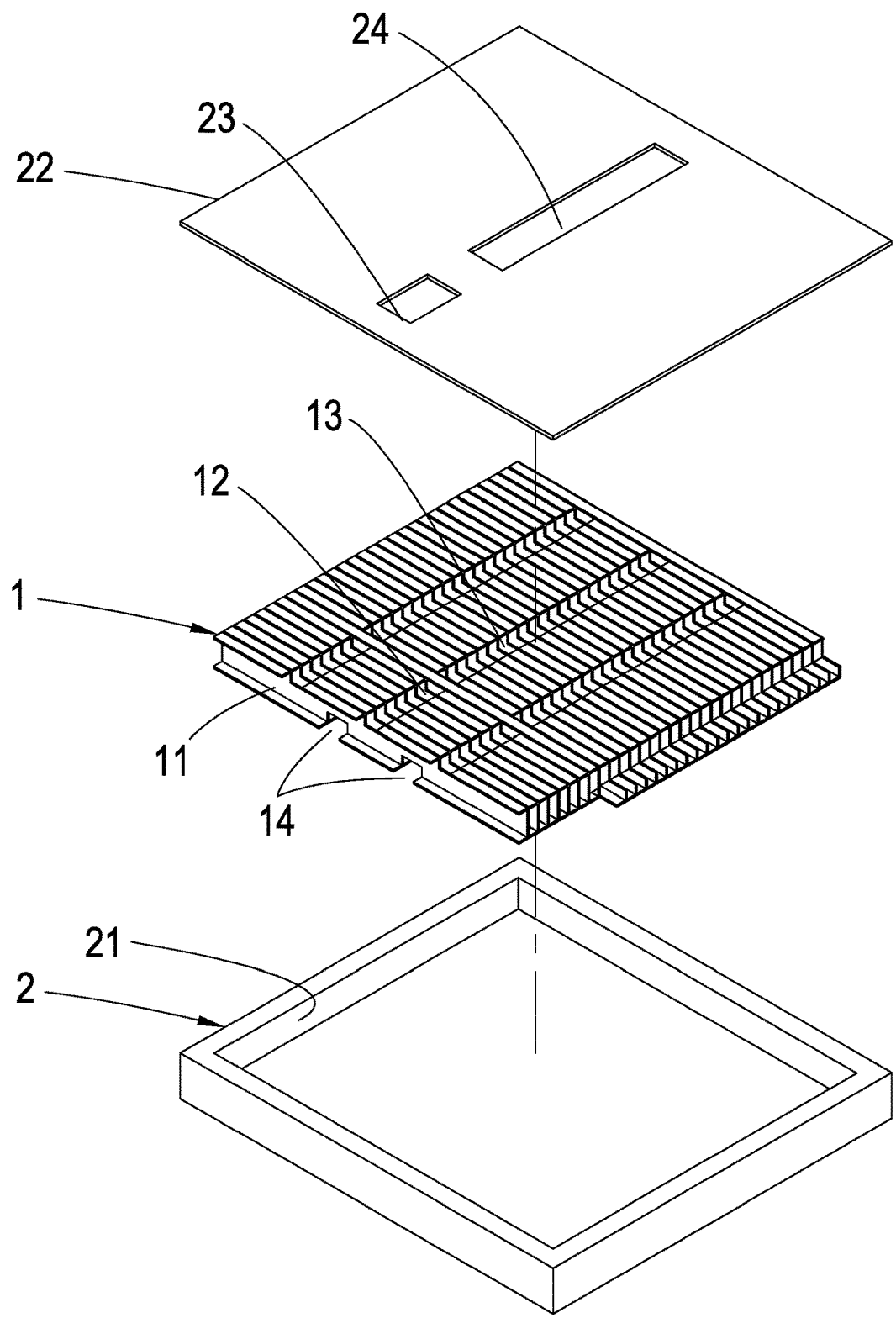
FIG. 12 shows a stereo disassembled view for the fourth embodiment of the current stabilization and pressure boosting device for evaporator according to the present invention.
Figure 13:
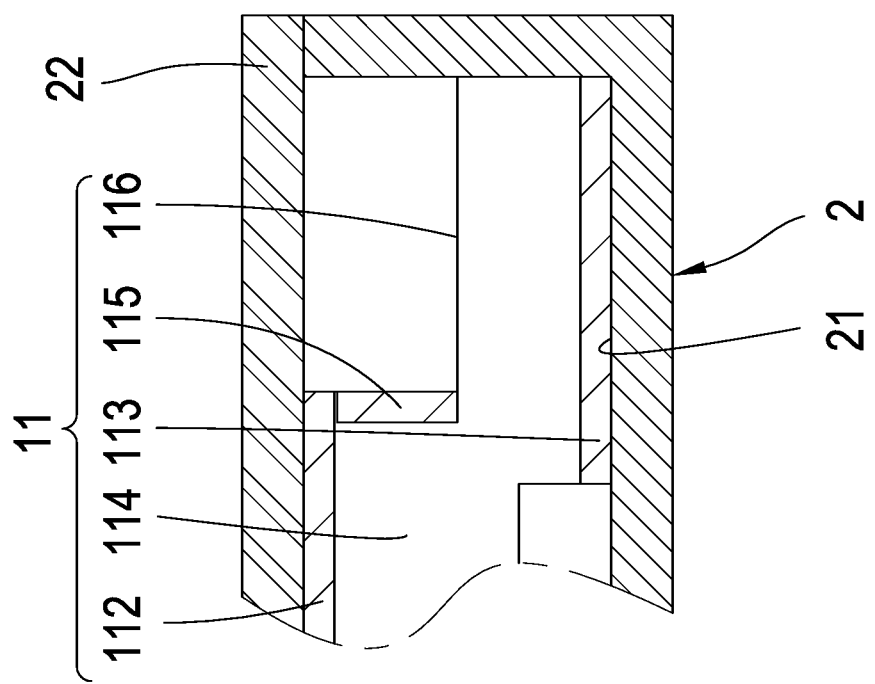
FIG. 13 shows a partial cross-sectioned view for the fourth embodiment of the current stabilization and pressure boosting device for evaporator according to the present invention.

Then, refer to FIGS. 12 and 13, in which a fourth embodiment for the integral structure configuration of the current stabilization and pressure boosting device for evaporator according to the present invention are shown. In the present embodiment, a predetermined space is configured between the two ends of each of the heat-sinking components 11 and the inner lateral surface of the chamber 21, with each of such heat-sinking components 11 provided with the respective air exhausting channel 13 being configured with a half-blocking form as illustrated in the fifth embodiment in FIG. 8D; in addition, the protrusion section 116 can be located between the two ends of the heat-sinking components 11 and the inner lateral surface of the chamber 21, and each of the fourth board surfaces 115 is blocked at the upside of the two ends of each of the inner flow channels 114 such that the liquid water or gaseous water within the inner flow channel 114 can not directly contact the chamber 21 and the outer lid 22 from the two ends of each of the inner flow channels 114, thereby eliminating the overflow and leakage issues at the joints; meanwhile, a large amount of liquid water or gaseous water can be retained in each of the inner flow channels 114, and the liquid water is stably heated and evaporated in order to allow gaseous water to rapidly increase the internal pressure to achieve a high pressure.

Figure 14:
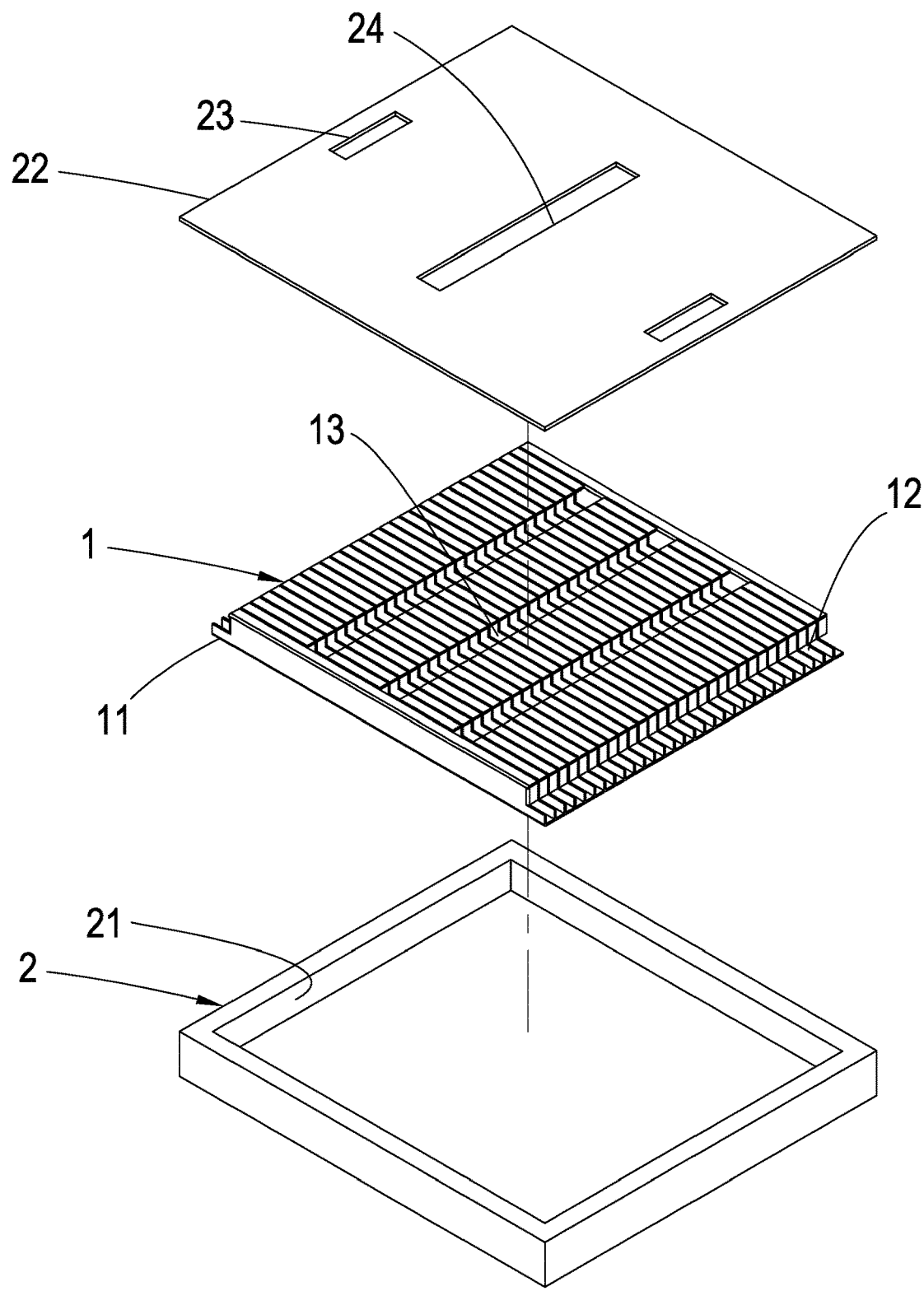
FIG. 14 shows a stereo disassembled view for the fifth embodiment of the current stabilization and pressure boosting device for evaporator according to the present invention.
Figure 15:
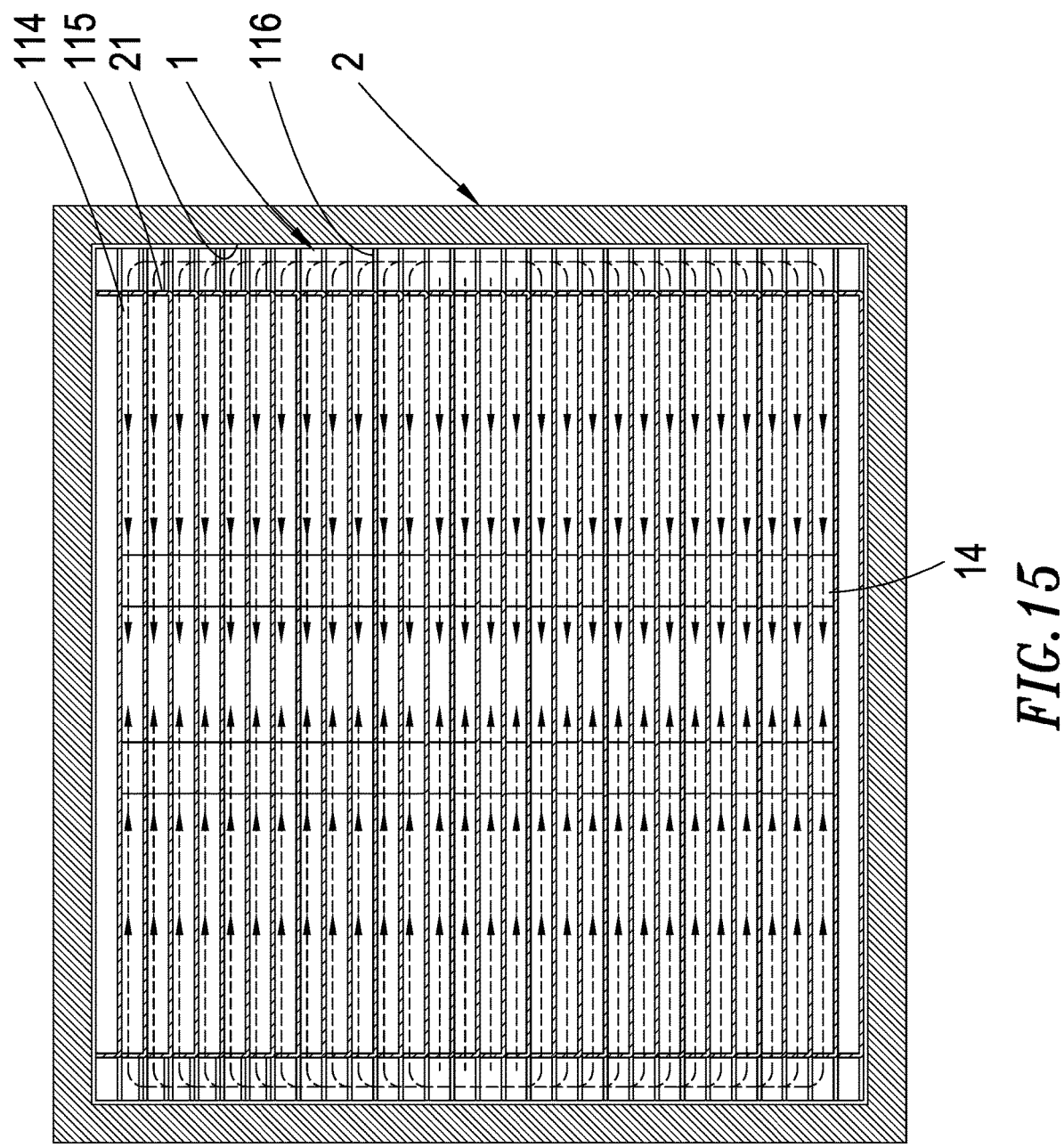
FIG. 15 shows an operating cross-sectioned view for the fifth embodiment of the current stabilization and pressure boosting device for evaporator according to the present invention.
Figure 16:
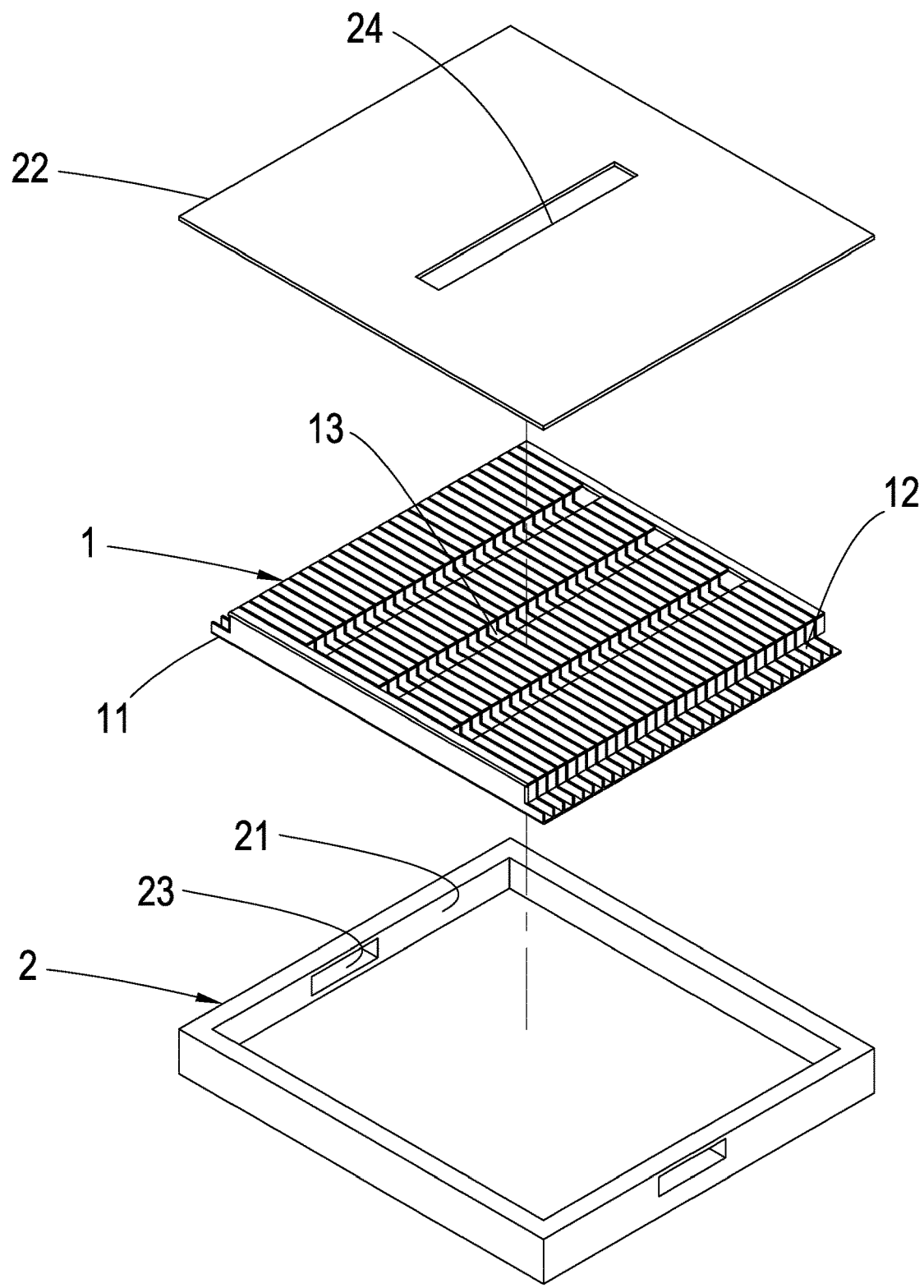
FIG. 16 shows an operating cross-sectioned view for the sixth embodiment of the current stabilization and pressure boosting device for evaporator according to the present invention.

Then, refer to FIGS. 14 and 15, in which a fifth embodiment for the integral structure configuration of the current stabilization and pressure boosting device for evaporator according to the present invention are shown. In the present embodiment, a predetermined space is configured between the two ends of each of the heat-sinking components 11 and the inner lateral surface of the chamber 21, with each of such heat-sinking components 11 provided with the respective air exhausting channel 13 being configured with a half-blocking form as illustrated in the fifth embodiment in FIG. 8D; in addition, the protrusion section 116 can be located between the two ends of the heat-sinking components 11 and the inner lateral surface of the chamber 21, and each of the fourth board surfaces 115 is blocked at the upside of the two ends of each of the inner flow channels 114; also, the water injection channel 12 is disposed at the upside of each of the protrusion sections 116, so that liquid water can sequentially pass through the water inlet 23, the water injection channel 12 and the downside of each of the fourth board surfaces 115 into each of the inner flow channels 114, and then circulate to the inside of the heat-sinking module 1 via each of the channels 14 such that the liquid water can be repeatedly evaporated into gaseous water after being heated. In this embodiment, the liquid water or gaseous water in each of the inner flow channels 114 will not directly contact the chamber 21 and the outer lid 22 from the two ends of each of the inner flow channels 114, thus eliminating the overflow and leakage issues at the joints. At the same time, a large amount of liquid water or gaseous water can be retained in each of the inner flow channels 114, in which the liquid water can be stably heated and evaporated to allow gaseous water to rapidly increase the internal pressure in order to form a high pressure; similarly, the liquid water can be stably heated and evaporated so that gaseous water can be quickly discharged by way of the air exhausting channel 13 thus stabilizing the internal water flow. Furthermore, refer to FIG. 16, in which a sixth embodiment for the integral structure configuration of the current stabilization and pressure boosting device for evaporator according to the present invention is shown. Compared with the fifth embodiment, in the present embodiment, it can be seen that the water inlet 23 is configured at the lateral side corresponding to each of the protrusion sections 116 (located on the outer case 2), so the present embodiment enables the same effect as that of the fifth embodiment.

The previously disclosed embodiments are merely illustrative of some preferred ones of the present invention, which are not intended to limit the scope thereof; those who are skilled in the relevant technical fields can, after understanding the technical features and embodiments of the present invention as explained hereinabove, certainly make equivalent changes, alterations or modifications without departing from the spirit and scope of the present invention, which are nonetheless deemed as falling within the coverage of the present invention; accordingly, the scope of the present invention to be protected by patent laws is subject to the definition of the claims attached to this specification.

What is claimed is:

1. A current stabilization and pressure boosting device for evaporator, comprising:
   a heat-sinking module, which is assembled by successively stacking a large number of heat-sinking components, with each of the heat-sinking components having a first board surface, a second board surface and a third board surface, so that an interior of such heat-sinking components form a semi-open inner flow channel, and a fourth board surface is further respectively provided at two ends of the heat-sinking components opposite to the inner flow channel, and the heat-sinking module is respectively configured with a water injection channel passing through some of the heat-sinking components and an air exhausting channel passing through some of the heat-sinking components, wherein the water injection channel and the air exhausting channel are not connected outside the heat-sinking module;
   an outer case, which is internally configured with a chamber for placing the heat-sinking module, and the outer case includes an outer lid for covering the chamber, and the outer case is further respectively configured with a water inlet and an air outlet, in which the water inlet is situated correspondingly to the water injection channel, and the air outlet is situated correspondingly to the air exhausting channel;

accordingly, the water inlet allows liquid water to flow in and evaporate in each of the inner flow channels, and then is discharged from the air outlet, and the fourth board surface can effectively block at both ends of each of the inner flow channels, so that the liquid water or gaseous water in each of the inner flow channels can be prevented from directly contacting the chamber and the outer lid from both ends of each inner flow channel, thus eliminating overflow and leakage issues, and, in addition, the liquid water or gaseous water can be massively retained in each inner flow channel, wherein liquid water can be stably heated and then evaporate thereby allowing gaseous water to be quickly discharged from the air exhausting channel so as to stabilize internal water flow by means of pressure boosting.

2. The current stabilization and pressure boosting device for evaporator according to claim 1, wherein the two ends of each of the heat-sinking components are closely attached to the chamber, and the heat-sinking module is configured with at least one channel penetrating each of the heat-sinking components.

3. The current stabilization and pressure boosting device for evaporator according to claim 1, wherein a predetermined space is configured between the two ends of each of the heat-sinking components and an inner lateral surface of the chamber, and the heat-sinking module is configured with at least one channel penetrating each of the heat-sinking components.

4. The current stabilization and pressure boosting device for evaporator according to claim 1, wherein the fourth board surface is formed by two ends of the first board surface extending toward the inner flow channel, and an extension length of the fourth board surface is the same as that of the second board surface and the third board surface, such that the fourth board surface is completely blocked at the both ends of each of the inner flow channels.

* * * * *